(12) United States Patent
Jin et al.

(10) Patent No.: US 6,284,675 B1
(45) Date of Patent: Sep. 4, 2001

(54) METHOD OF FORMING INTEGRATED CIRCUIT DIELECTRIC BY EVAPORATING SOLVENT TO YIELD PHASE SEPARATION

(75) Inventors: Changming Jin, Austin; Joseph D. Luttmer, Richardson, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/320,014

(22) Filed: May 26, 1999

Related U.S. Application Data

(60) Provisional application No. 60/086,954, filed on May 27, 1998.

(51) Int. Cl.$^7$ .................................................. H01L 21/469
(52) U.S. Cl. ............................................. 438/778; 438/790
(58) Field of Search ....................................... 438/778, 790

(56) References Cited

U.S. PATENT DOCUMENTS

| 5,449,733 | * | 9/1995 | Zyss et al. ........................... 528/9 |
| 5,668,398 | * | 9/1997 | Havemann et al. ............... 257/522 |
| 5,736,425 | * | 4/1998 | Smith et al. ....................... 438/778 |

* cited by examiner

*Primary Examiner*—Wael Fahmy
*Assistant Examiner*—William M. Brewster
(74) *Attorney, Agent, or Firm*—Carlton H. Hoel; W. James Brady; Frederick J. Telecky, Jr.

(57) ABSTRACT

A phase separation during solvent evaporation of a solution containing polymer precursors leaves low pressure solvent without polymer precursor in minimal gaps. After polymerization, drive off the low pressure solvent to yield air gaps in the minimal gaps under the polymer.

1 Claim, 7 Drawing Sheets

METHOD OF FORMING INTEGRATED CIRCUIT DIELECTRIC BY EVAPORATING SOLVENT TO YIELD PHASE SEPARATION

RELATED APPLICATIONS

The following patent applications disclose related subject matter: Ser. No. 09/087,234, filed May 28, 1998. This application has a common assignee with the present application. This application claim benefit to provisional application No. 60/086,954 May 27, 1998.

BACKGROUND OF THE INVENTION

The invention relates to electronic semiconductor devices, and, more particularly, to dielectric structures and fabrication methods for such structures.

The performance of high density integrated circuits is dominated by metal interconnect level RC time delays due to the resistivity of the metal lines and the capacitive coupling between adjacent lines. The capacitive cooling can be reduced by decreasing the relative permittivity (dielectric constant, k) of the dielectric (insulator) between adjacent lines.

Various dielectric materials have been suggested for use in silicon integrated circuits; namely, silicon dioxide (k about 4.0), fluorinated silicon dioxide (k about 3.0–4.0), organic materials such as polyimide, parylene, amorphous teflon (k about 1.9–3.9), and porous dielectrics such as silicon dioxide xerogels (k dependent upon pore size and typically 1.3–3.0). The porosity can be up to 99% by volume. See Smith et al, Preparation of Low-Density Xerogel at Ambient Pressure for Low k Dielectrics, 381 Mat.Res-.Soc.Symp.Proc. 261 (1995).

Thin film silica xerogels for integrated circuit dielectric use can be fabricated by the generic steps of (1) precursor preparation, (2) spin coat, (3) age, (4) solvent exchange, and (5) dry. The acid-base sol-gel reactions could be as follows:

Hydrolyze an alkoxide in a solvent:

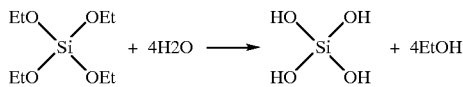

The solvent could be ethanol.

Then condense (gel) the hydrolyzed alkoxides:

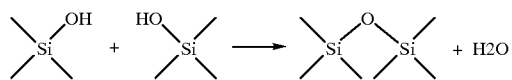

The condensation would be controlled so that spin coating occurs after partial condensation to a convenient viscosity.

The solvent exchange replaces the original solvent residing within the pores of gel by low-surface-tension solvent to reduce the capillary pressure during drying and minimizing the collapse of the pores. U.S. Pat. No. 5,561,318 discloses variations of the process.

However, silica xerogels with very low dielectric constants have low mechanical strength due to the high porosity and present manufacturability problems.

SUMMARY OF THE INVENTION

The present invention provides silica xerogel dielectrics with essentially 100% porosity in minimal gaps but lower porosity in bulk regions to achieve mechanical strength for use as a multilevel integrated circuit dielectric.

This has the advantages of low dielectric constant in minimal gaps but with higher mechanical strength in bulk regions for manufacturability.

BRIEF DESCRIPTION OF THE DRAWINGS

The drawings are heuristic for clarity.

DESCRIPTION OF THE PREFERRED EMBODIMENTS

Overview

The preferred embodiments provide xerogels with a phase separation during formation which migrates the majority of the polymeric material out of minimal gaps between adjacent interconnect lines and yields an "air" gap under a xerogel layer as an interlevel dielectrics in multilevel interconnect integrated circuits.

Gapfill Preferred Embodiment FIGS. 1a–g illustrate in cross sectional elevation views the steps of preferred embodiment fabrication methods for integrated circuit (e.g., CMOS or BiCMOS) as follows.

Figure 1A:
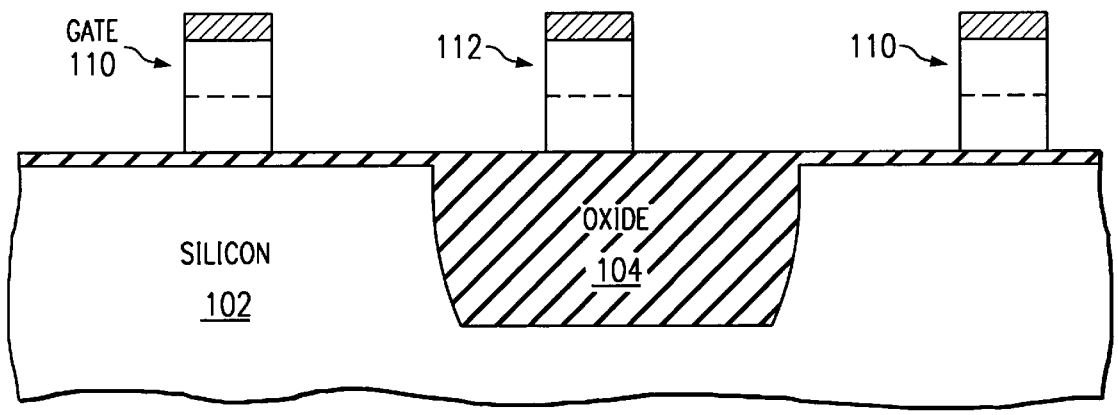
FIGS. 1a–h are cross sectional elevation views of a preferred embodiment integrated circuit fabrication method steps.
Figure 1B:
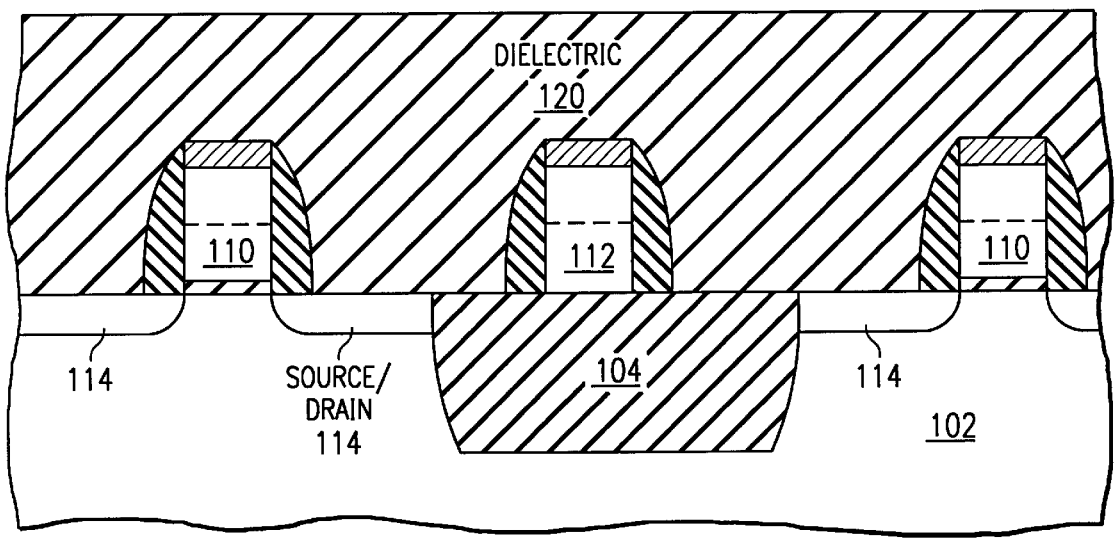

(1) Start with a silicon wafer (or silicon on insulator wafer) with shallow trench isolation and twin wells for CMOS devices (optionally, plus memory cell array wells and bipolar device buried layers). Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates plus gate level interconnects. The gate material could also provide a polysilicon emitter for bipolar devices which would also require a prior base implant. See FIG. 1a which shows silicon substrate 102 with shallow trench isolation oxide 104 plus gates 110 and gate level interconnect 112. Gates 110 may be 200–300 nm high and 130–250 nm long (FIG. 1a is a cross section along the gate length, and gates typically have widths much greater than their lengths). An alternative would be formation of polysilicon gates followed by a self-aligned silicidation (after the source/drain and sidewall dielectric formation of the next step) to create a silicide on both the gate top and the source/drains.

(2) Perform lightly doped drain implants, and then form sidewall dielectric on the gates by deposition plus anisotropic etching. Introduce dopants to form sources and drains 114. Cover the gate level structure with a planarized dielectric layer 120 (such as BPSG or a stack of conformal and planarized layers with the top layer an undoped oxide such as a deposition from TEOS); see FIG. 1b.

(3) For a structure with an embedded memory cell array using one-transistor one-capacitor memory cells, the bitlines and cell capacitors may be formed next. For clarity such steps are not illustrated and attendant additional dielectrics deposited on dielectric 120 will just be considered part of dielectric 120.

(4) Photolithographically define and etch holes (contacts, vias) in planarized dielectric 120 down to selected source/drains 114 and locations on gate level interconnects 112 (and also to selected bitline locations for embedded memory). Blanket deposit (including filling vias) a metal stack such as 50 nm of Ti, 50 nm of TiN, 500 nm of W or Al (doped with Cu and Si), and 50 nm of TiN; the bottom Ti and TiN form a diffusion barrier and the top TiN forms an antirefletive coating for lithography. Prior to the W or Al deposition the bottom Ti may be reacted with the source/drain to form a silicide to stabilize the metal-to-silicon contact. The Ti and TiN may be deposited by physical vapor deposition (PVD) or chemical vapor deposition (CVD) (e.g., TiCl4+ NH3→TiN+HCl); the aluminum may be deposited by PCD and then forced into the vias under high pressure or by CVD; and W may be deposited by CVD. Alternatively, the vias may be filled with W by a CVD blanket deposition followed by an etchback to leave W only in the vias (W plug), and then blanket Ti, TiN, Al, and TiN depositions.

Figure 1C:
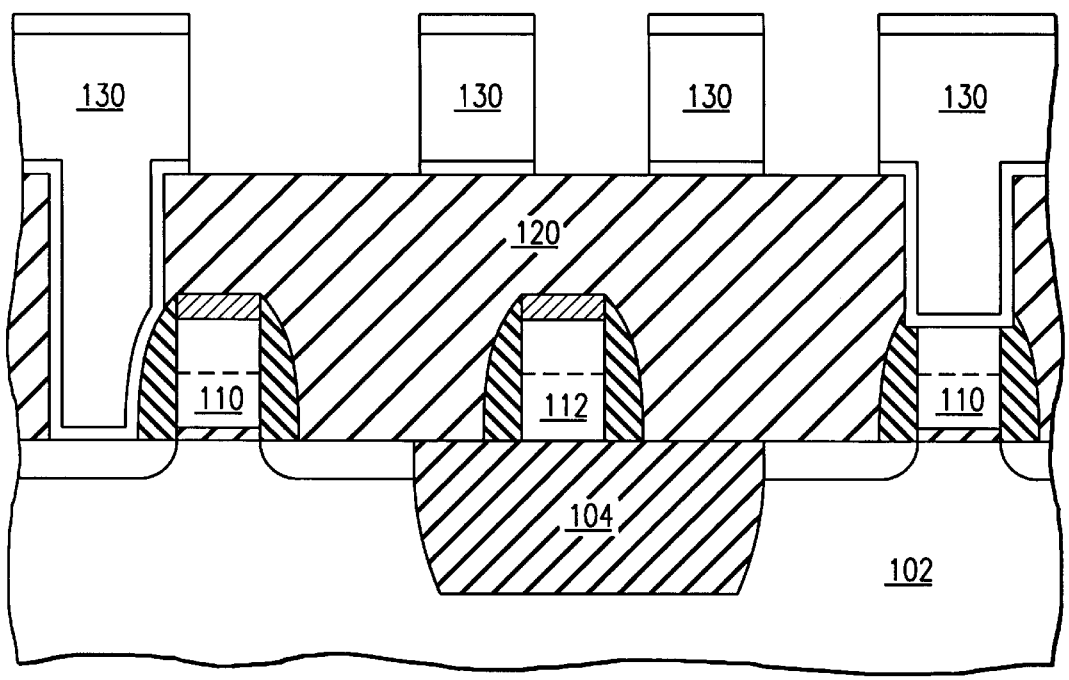
Figure 1D:
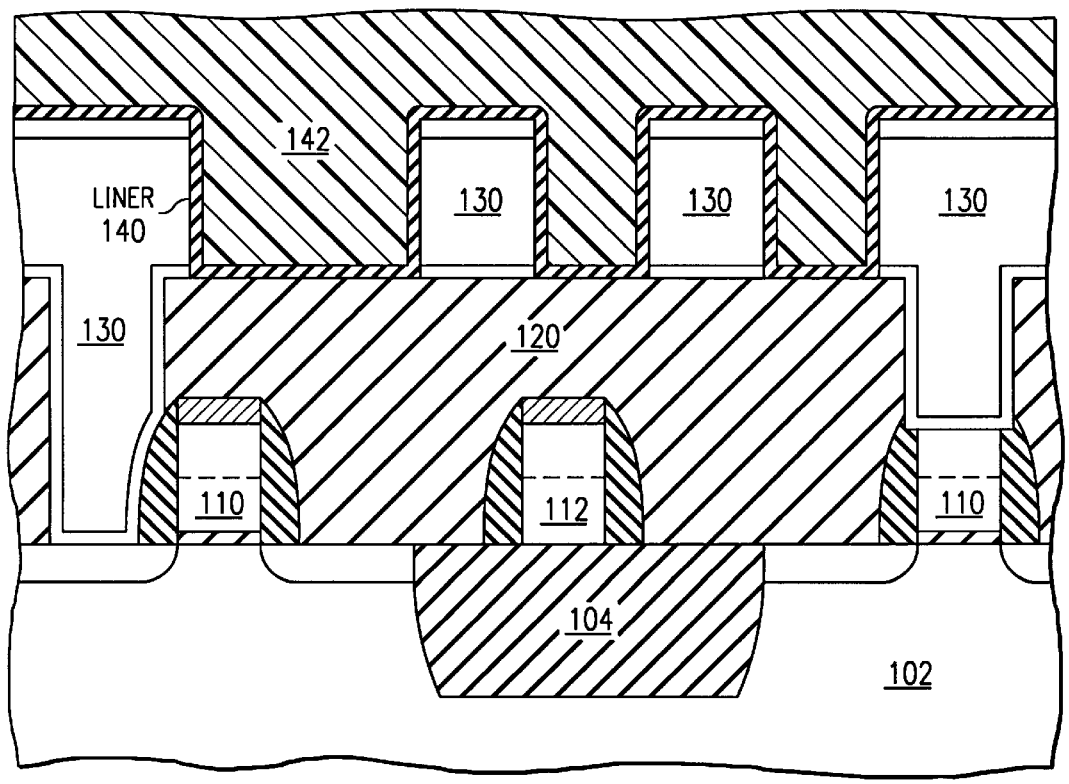

(5) Photolithographically define and etch the first level metal to form first level interconnects 130; see FIG. 1c. The gaps between adjacent interconnects 130 may be on the order of 200–300 nm or less, and these minimal gaps dominate the capacitive couplings.

(6) Deposit a 5 nm thick conformal oxide liner 140 on interconnects 130 plus exposed dielectric 120 by plasma-enhanced decomposition of TEOS with oxygen or ozone. Liner 140 passivates the metal surfaces and prevents diffusion of metal along the pores of the subsequent deposited xerogel. It also provides mechanical strength to suppress electromigration and suppress interconnect-to-interconnect leakage current. Other dielectric liner materials may be used, but the liner material contributes to the effective dielectric constant between the minimal gaps. Thus high dielectric constant liner material must be very thin.

(7) Spin coat the liner 140 covered surface with a solution of xerogel precursor solution of oligomers condensed from hydrolyzed TEOS monomers and water plus tetraethylene glycol (TEG) plus an acid in an ethanol solvent. A catalyst (NH4OH) could be added before coating, but it is preferred to add the catalyst in vapor phase after deposition. The viscosity of the coating solution determines the planarity of the resulting xerogel, and the fraction of TEOS oligomers determines the porosity of the final xerogel. A solution of 24% TEOS, 50% ethanol, 24% TEG, 2% water, and 0.08% 1M HNO3 by volume is convenient.

The ethanol is a common solvent for the oligomers, water, and TEG; but due to the thinness of the spun on coating (e.g., a few um), the ethanol rapidly evaporates (b.p. 78 C for ethanol compared to 328 C for TEG and 100 C for water). The ethanol evaporation initially leaves a high viscosity liquid film. The high viscosity film 142 may be thick enough to cover the tops of the interconnects 130 by roughly 200 nm, fill the minimal gaps, and be roughly 600 nm thick in open areas between interconnects. About 3 ml of precursor on an 8 inch wafer will suffices; see FIG. 1d.

Figure 1E:
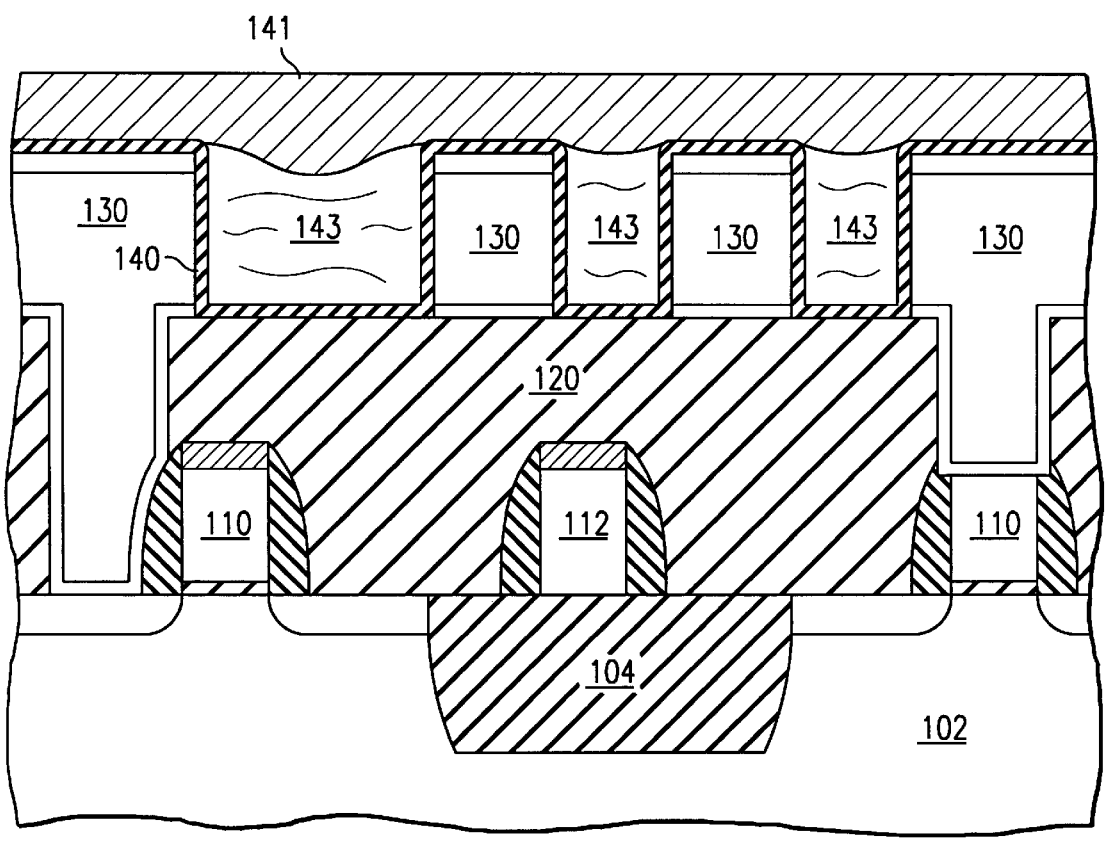
Figure 1F:
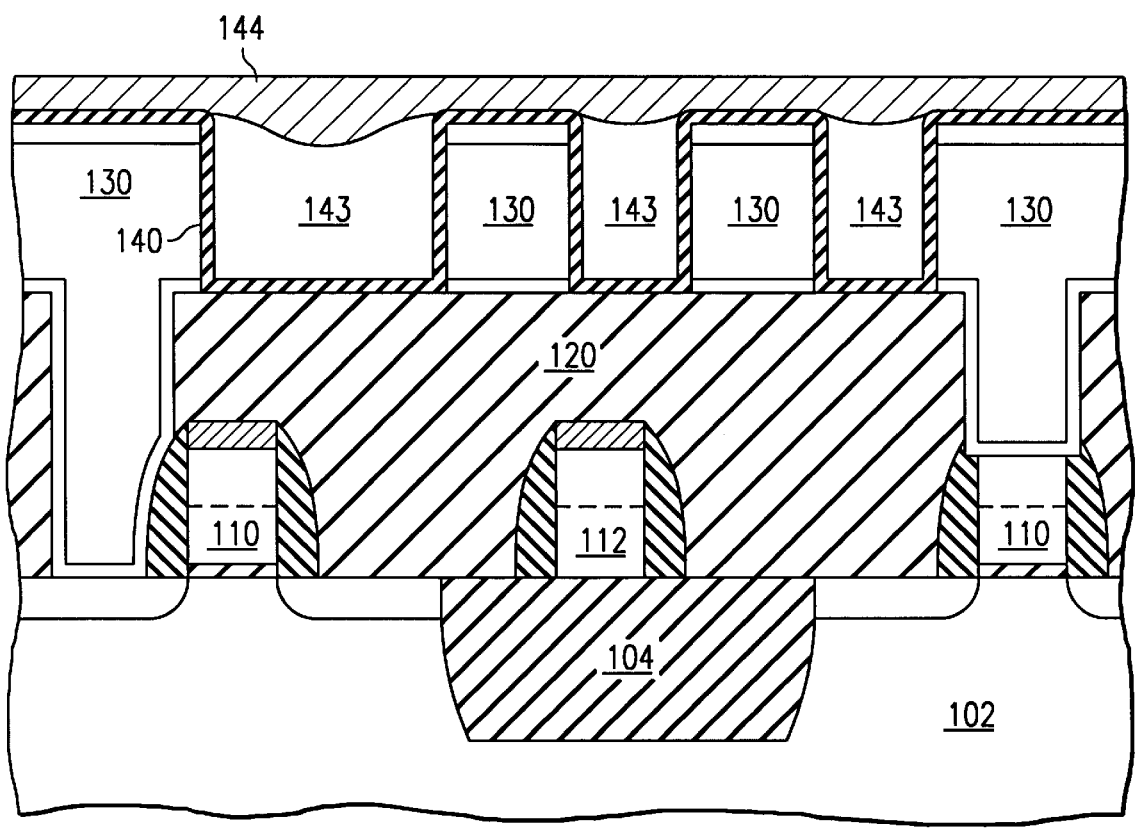
Figure 1G:
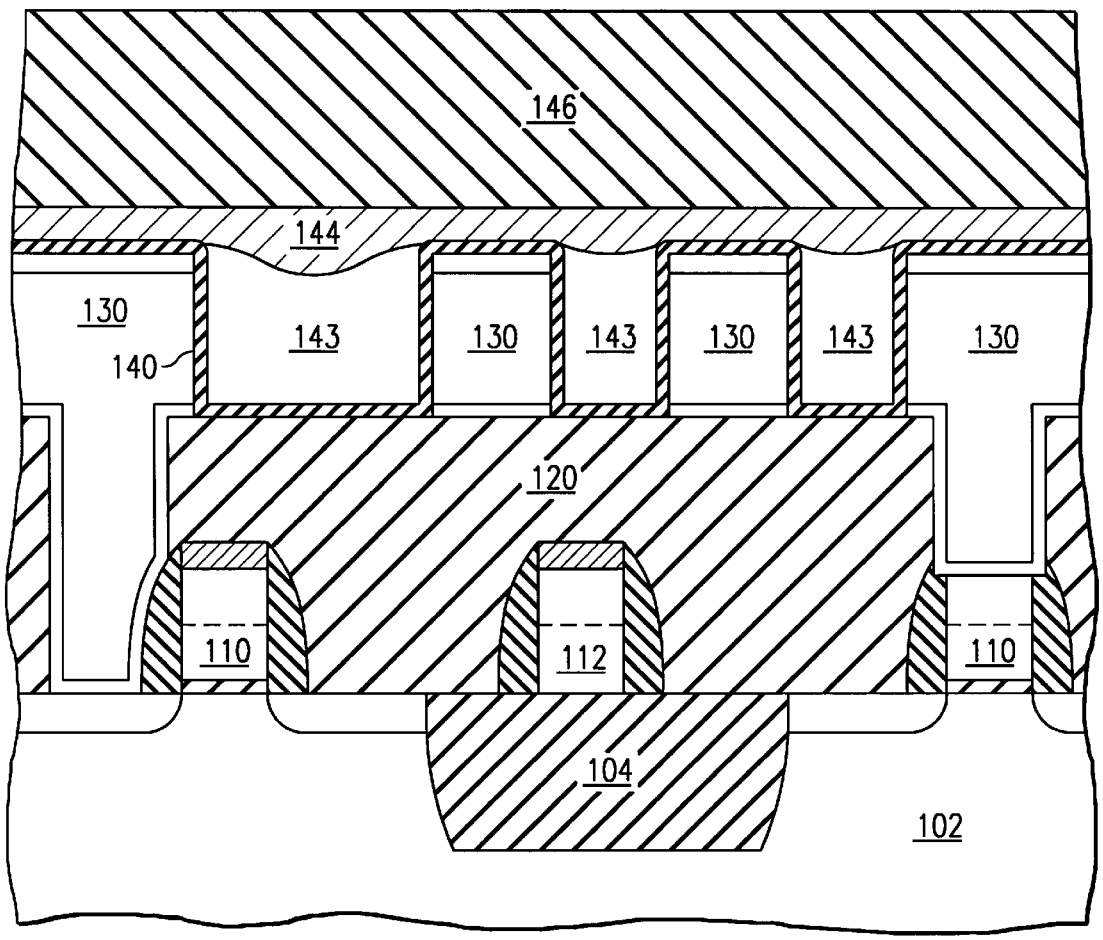

The ethanol evaporation also causes a phase separation in the high viscosity film prior to significant polymerization of the oligomers: TEG alone fills the minimal gaps between interconnects and the oligomers plus water saturated with TEG form an overlying layer. See FIG. 1e showing oligomer-water-TEG layer 141 and minimal gaps 143 with only TEG. Note that the high viscosity liquid does not show this phase separation in the open field regions away from the minimal gaps.

(8) Age the coated wafer at room temperature in a flowing NH4OH catalyst atmosphere for 1–20 minutes. Alternatively, decrease the reaction time by heating to 120 C for 1–4 minutes during the catalyst flow. During this aging the condensation reaction in layer 141 yields a porous polymer network with water and TEG in the pores; that is, a gel. The porosity need not be high because the polymer is not located in the minimal gaps. The TEG has a low vapor pressure and will remain in the minimal gaps 143 during the aging.

(9) Replace the TEG and water in the polymer network pores plus the TEG in the minimal gaps with ethanol or some other low surface tension liquid by continuous spin coating with ethanol. The polymer should have at least 10–20% porosity for migration of the TEG through the gel at a reasonable rate. Without this replacement the high surface tension of the original solvent may (partially) collapse the polymer network during solvent evaporation due to surface tension within the drying pores. However, if the polymer network is strong enough to withstand the surface tension, then this step could be omitted.

(10) Spin a source of hydrophobic groups, such as hexamethyldisilizane (HMDS), onto the gel to convert any remaining hydroxyl groups on the polymer network to hydrophobic groups, such as trimethylsilyl groups. The reaction could be of the type:

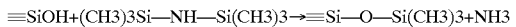

$$\equiv \text{SiOH} + (\text{CH}_3)_3\text{Si}-\text{NH}-\text{Si}(\text{CH}_3)_3 \rightarrow \equiv \text{Si}-\text{O}-\text{Si}(\text{CH}_3)_3 + \text{NH}_3$$

Typically, the overall hydrolysis plus condensation reaction converts roughly 70% of the ethoxysilicon bonds of the TEOS to siloxane bonds and the remaining 30% of the ethoxysilicon bonds mostly into silanol bonds. The hydrophobic group substitution eliminates most of these silanol bonds. The silanol groups are hydrophilic and induce higher dielectric constants and cause potential metal corrosion problems.

(11) Rinse the wafer with a low surface-tension liquid such as hexane. If the polymer network of the gel is strong enough, then this solvent exchange may be omitted. Evaporate the majority of the hexane by heating the wafer to 300–350 C for about 60 seconds to evacuate the minimal gaps plus dry the gel and thereby form a xerogel which consists of the polymer network with vapors/air in the pores. The xerogel may be 50–90% pores and 10–50% polymer network by volume with the pores having an average diameter on the order of 10–20 nm.

(12) Further dry the hydrophobic xerogel in a reducing atmosphere of forming gas (95% N2+5% H2) at 425 C for 30 minutes. The drying drives residual liquid out of the minimal gaps and xerogel pores. This yields xerogel layer 144 over empty (vapor filled) minimal gaps 143; see FIG. 1f.

Note that the xerogel in the gaps between interconnects is constrained by the surrounding surfaces and cannot shrink (without pulling loose from a surface), whereas the overlying xerogel may shrink down without constraint. Thus the relative pore volume in the gaps may be higher than the relative pore volume above the interconnects, and thus the dielectric constant may be lower in the gaps than above the interconnects.

(13) Deposit a 1500 nm thick dielectric 146 on the xerogel 144 by plasma enhanced decomposition of TEOS with oxygen or ozone. The surface of xerogel 144 could be prepared for the oxide deposition (to increase adhesion of the oxide) by removing surface hydrophobic groups with a short hydrogen or oxygen or ammonia plasma treatment or spin coat with a thin layer of adhesion promoter such as hydrogen silsesquioxane (HSQ). Then planarize dielectric 146 with chemical mechanical polishing (CMP) to provide for an intermetal level dielectric thickness of about 1000 nm; see FIG. 1g which shows the effective air gaps 143 between adjacent metal interconnects with liner 140 to prevent breakdown in the air gaps.

Figure 1H:
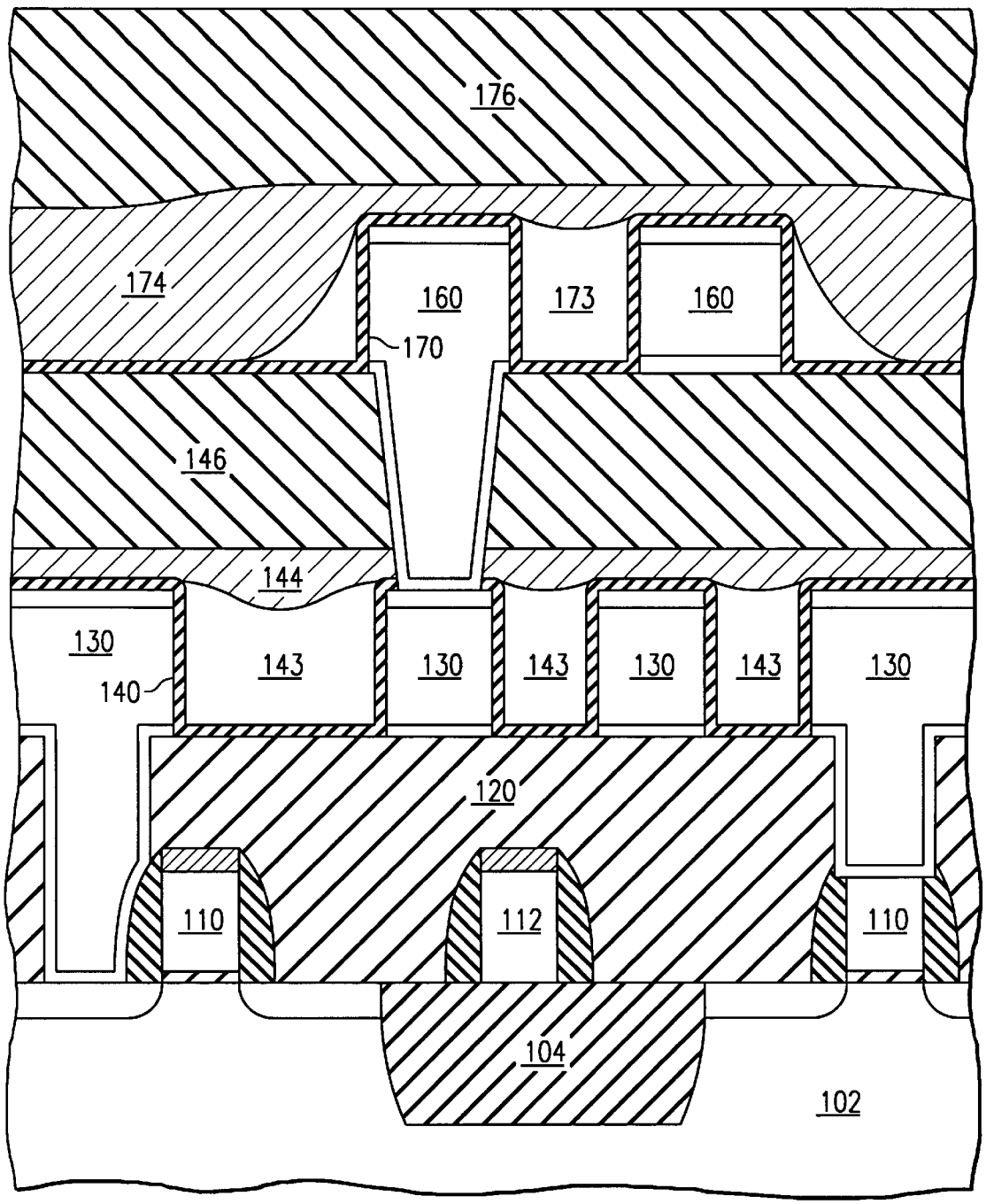

This completes the first metal level interconnects; and further levels result from repetition steps (4)–(13) where the vias in the planarized dielectric extend down to immediately underlying interconnects. Note that a via may effectively extend through two or more levels by simply forming a vertical stack of vias and overlying small metal patches. FIG. 1h illustrates a second metal level with second level interconnects 160, second level oxide liner 170, second level air gaps 173, second level xerogel 174, and covering oxide 176. Completion of an integrate circuit would include a passivation overcoat on the top level metal and an etch to open upon bond pads which would be formed in the top level metal.

Gapfill Without Liner

The preceding preferred embodiment provided thin oxide liner 140 which passivates the metal plus helps suppress breakdown in the air gaps when adjacent interconnects are at a maximum voltage difference. However, liner 140 could be omitted, especially if the interconnect metal has a barrier which provides passivation. The phase separation in the xerogel precursor solution as the ethanol evaporates may leave a thin layer of oligomers on the metal surface due to reaction of the oligomers (the silanol groups) with the metal or barrier. Thus the passivation and breakdown suppression functions of the liner may be achieved by a thin adhered xerogel layer on the metal.

Slot Geometry Preferred Embodiment

Figure 2A:
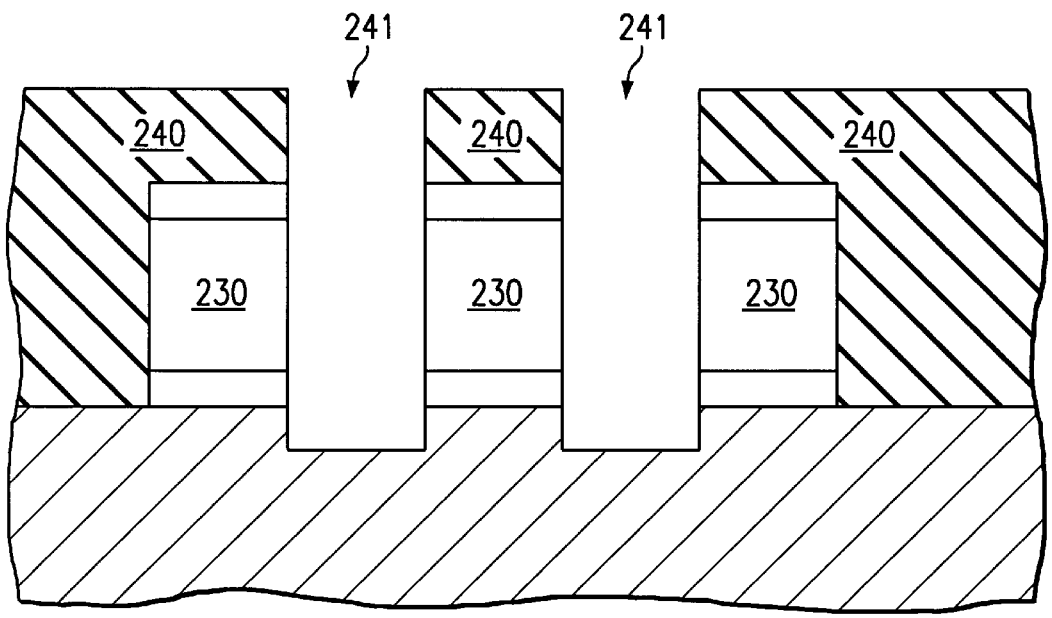
FIGS. 2a–b illustrate in cross sectional elevation views another preferred embodiment.
Figure 2B:
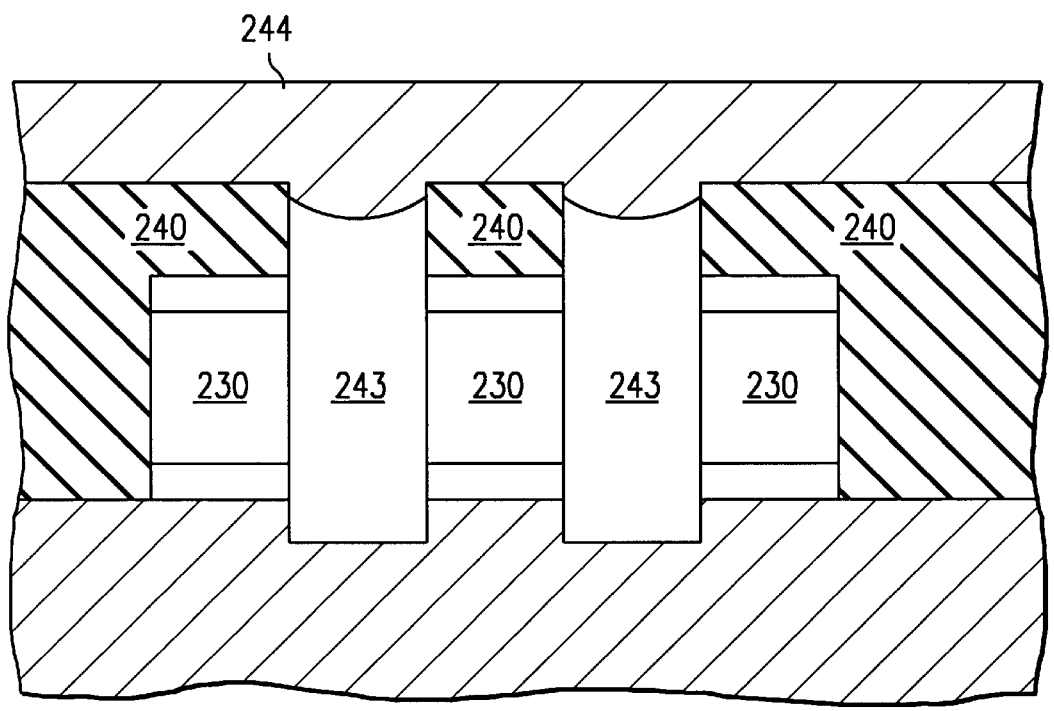

A further preferred embodiment deposits oxide over the interconnects, etches trenches between minimally spaced interconnects, and then fills the trenches with xerogel precursor as in the foregoing embodiments. In particular, FIGS. 2a–c illustrate this approach. FIG. 2a shows trenches 241 which have been etched in planarized oxide 240 and between minimally spaced adjacent interconnects 230. Again, interconnects 230 may be 700 nm high and 200 nm wide with the minimal spacing of 200 nm.

Next, spin on a xerogel precursor solution as in the prior preferred embodiments which fills trenches 241 plus the horizontal portions of oxide 240. Again, when the ethanol evaporates, the resulting high viscosity solution undergoes phase separation and TEG fills the bottom portions 243 of the trenches and the oligomer-water-TEG solution forms an overlying layer 244. Then polymerize to form the gel and dry to form xerogel 244; see FIG. 2b. FIG. 2b is analogous to FIG. 1f, and another interconnect level can be formed by analogs of the steps of FIGS. 1g–h: deposit a planarized oxide, etch vias, deposite metal, pattern metal, deposit oxide, etch minimal gap trenches, xerogel precursor application, phase separation, polymerization and drying. Note that limiting the trenches 241 to minimal gap areas away from where vias will be etched down to the interconnects 230 prevents a via etch from breaking into an air gap and the subsequent metal via fill also filling the air gap and shorting the interconnects.

Interconnects 230 could have a silicon nitride liner; this permits selective oxide etching the trenches in the minimal gaps between adjacent interconnects and leaving the nitride liner as passivation of metal interconnects 230. However, such a liner will increase the effective dielectric constant between the adjacent interconnects.

Modifications

The preferred embodiments can be modified in various ways while retaining the feature of air gap formation.

For example, the ethanol solvent can be replaced by any volatile solvent such as methanol, propanol, diethyl ether, etc. The oligomers may be any monomers and/or oligomers that polymerize to a strong enough dielectric, and the TEG could be replaced by any solvent with low vapor pressure and which will phase separate from the polymerizable monomers and/or oligomers when the volatile solvent evaporates.

What is claimed is:

1. A method of dielectric fabrication, comprising the steps of:

(a) providing a surface with gaps;

(b) coating said surface with a solution including polymer precursors, a first solvent, and a second solvent, said second solvent with a lower vapor pressure than said first solvent;

(c) evaporating said first solvent to yield a phase separation with said gaps containing said second solvent without said polymer precursors;

(d) polymerizing said polymer precursors; and (e) removing said second solvent from said gaps.

* * * * *